(12) United States Patent
Lu

(10) Patent No.: US 12,159,687 B2
(45) Date of Patent: Dec. 3, 2024

(54) CLOCK CIRCUIT, MEMORY AND METHOD FOR MANUFACTURING SEMICONDUCTOR STRUCTURE

(71) Applicant: CHANGXIN MEMORY TECHNOLOGIES, INC., Anhui (CN)

(72) Inventor: Meixiang Lu, Anhui (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 248 days.

(21) Appl. No.: 17/651,624

(22) Filed: Feb. 18, 2022

(65) Prior Publication Data
US 2023/0028479 A1 Jan. 26, 2023

Related U.S. Application Data

(63) Continuation of application No. PCT/CN2021/117287, filed on Sep. 8, 2021.

(30) Foreign Application Priority Data

Jul. 20, 2021 (CN) .......................... 202110821447.5

(51) Int. Cl.
*G11C 5/06* (2006.01)
*G06F 30/367* (2020.01)
(Continued)

(52) U.S. Cl.
CPC ............ *G11C 7/222* (2013.01); *G06F 30/367* (2020.01); *G06F 30/3953* (2020.01);
(Continued)

(58) Field of Classification Search
CPC ....... G11C 5/063; G11C 7/18; G11C 11/4097; G11C 5/025
(Continued)

(56) References Cited

U.S. PATENT DOCUMENTS 5,416,431 A 5/1995 Strauss
5,969,544 A 10/1999 Iwao
(Continued)

FOREIGN PATENT DOCUMENTS

CN 101351886 B 5/2012
CN 107068670 A 8/2017
(Continued)

OTHER PUBLICATIONS

Supplementary European Search Report in the European application No. 21881356.6, mailed on Jan. 4, 2023.
(Continued)

*Primary Examiner* — Son T Dinh
(74) *Attorney, Agent, or Firm* — Syncoda LLC; Feng Ma

(57) ABSTRACT

A clock circuit includes at least two first driving circuits and a plurality of discrete first wires located between adjacent first driving circuits, the adjacent first driving circuits are connected through at least one first wire and at least two second wires, the first driving circuits are connected with the second wires, all of the first wires connected between two second wires are connected in series with each other, the first wires are located on a first metal layer, the second wires are located on a second metal layer, and the second metal layer is above the first metal layer.

12 Claims, 4 Drawing Sheets

(51) Int. Cl.
  *G06F 30/3953* (2020.01)
  *G06F 30/398* (2020.01)
  *G11C 7/10* (2006.01)
  *G11C 7/22* (2006.01)

(52) U.S. Cl.
  CPC ............ *G06F 30/398* (2020.01); *G11C 5/063* (2013.01); *G11C 7/1051* (2013.01)

(58) Field of Classification Search
  USPC ..................................................... 365/63, 51
  See application file for complete search history.

(56) References Cited

U.S. PATENT DOCUMENTS

| | | | |
|---|---|---|---|
| 8,432,210 | B2 | 4/2013 | Brown |
| 8,621,407 | B2 | 12/2013 | Sakata |
| 2012/0105123 | A1 | 5/2012 | Brown |
| 2012/0139602 | A1 | 6/2012 | Sakata |
| 2017/0076760 | A1* | 3/2017 | Yabuuchi ............ H01L 27/0886 |
| 2018/0314771 | A1 | 11/2018 | Lee et al. |
| 2019/0325107 | A1 | 10/2019 | Kim et al. |
| 2020/0081782 | A1 | 3/2020 | Eichmeyer et al. |

FOREIGN PATENT DOCUMENTS

| | | | |
|---|---|---|---|
| CN | 108281419 | A | 7/2018 |
| CN | 108804734 | A | 11/2018 |
| CN | 108920730 | A | 11/2018 |
| CN | 110719102 | A | 1/2020 |
| CN | 111105826 | A | 5/2020 |
| CN | 107683474 | B | 11/2020 |
| CN | 112906342 | A | 6/2021 |
| JP | H06274241 | A | 9/1994 |
| JP | H11330928 | A | 11/1999 |
| JP | 2000323659 | A | 11/2000 |
| JP | 2001034647 | A | 2/2001 |
| JP | 2001053233 | A | 2/2001 |
| JP | 2009076679 | A | 4/2009 |
| JP | 2009259909 | A | 11/2009 |
| JP | 2011077423 | A | 4/2011 |
| JP | 2012123524 | A | 6/2012 |
| JP | 2012137986 | A | 7/2012 |
| JP | 2017055041 | A | 3/2017 |
| JP | 2019009345 | A | 1/2019 |
| TW | 1220773 | B | 9/2004 |

OTHER PUBLICATIONS

First Office Action of the Japanese application No. 2022-547938, issued on Oct. 10, 2023. 5 pages with English translation.
First Office Action of the Taiwanese application No. 111123890, issued on Apr. 11, 2023. 6 pages with English translation.
International Search Report in the international application No. PCT/CN2021/117287, mailed on Apr. 19, 2022. 6 pages with English translation.
Notice of Allowance of the Chinese application No. 202110821447.5, issued on May 24, 2023. 5 pages with English translation.

* cited by examiner

US 12,159,687 B2

CLOCK CIRCUIT, MEMORY AND METHOD FOR MANUFACTURING SEMICONDUCTOR STRUCTURE

CROSS-REFERENCE TO RELATED APPLICATIONS

This is a continuation of International Application No. PCT/CN2021/117287 filed on Sep. 8, 2021, which claims priority to Chinese Patent Application No. 202110821447.5 filed on Jul. 20, 2021. The disclosures of these applications are hereby incorporated by reference in their entirety.

BACKGROUND

In the field of semiconductors, a basis for ensuring effective operation of a semiconductor device is to control different function modules to output or receive data signals according to a preset time sequence. In order to ensure the accuracy of a clock signal corresponding to a certain data signal, a main path, an auxiliary path and a feedback unit may be provided in a clock module for outputting the clock signal, the main path is configured to receive a preset signal and output the clock signal, the auxiliary path is configured to receive the preset signal, a function module of the auxiliary path is the same as a function module of the main path, and the feedback unit regulates and controls the main path based on a comparison result of the output signal of the auxiliary path and the preset signal so as to meet the time sequence requirement of the main path.

SUMMARY

Embodiments of the disclosure relate to a clock circuit, a memory and a method for manufacturing a semiconductor structure.

The embodiments of the disclosure provide a clock circuit, which includes at least two first driving circuits and a plurality of discrete first wires located between adjacent first driving circuits, the adjacent first driving circuits are connected through at least one first wire and at least two second wires, the first driving circuits are connected with the second wires, all of the first wires connected between two second wires are connected in series with each other, the first wires are located on a first metal layer, the second wires are located on a second metal layer, and the second metal layer is above the first metal layer.

Correspondingly, the embodiments of the disclosure further provides a method for manufacturing a semiconductor structure, which includes: a number of second driving circuits is calculated according to a preset delay duration, and after the number of the second driving circuits is determined, a length of a connection between adjacent second driving circuits is calculated according to a length of a preset conductive path; the adjacent second driving circuits are connected through third wires; at least two first driving circuits are provided, a plurality of discrete first wires located between the adjacent first driving circuits are provided, a number of the first driving circuits is the same as the number of the second driving circuits, the first wires are located on a first metal layer, and a metal layer where the third wires is located is above the first metal layer; a number of the first wires, designated as an initial number, connected in series between the adjacent first driving circuits is calculated according to the length of the connection, a resistance per unit length of the third wires, a resistance per unit length of the first wires and a length of each first wire, so that an ideal value of resistance between the adjacent first driving circuits is equal to an ideal value of resistance between the adjacent second driving circuits; and second wires are provided, so that the initial number of the first wires are connected in series between the adjacent first driving circuits, the second wires are connected with the first driving circuits, all of the first wires connected between two second wires are connected in series with each other, the second wires are located on a second metal layer, and the second metal layer is above the first metal layer.

BRIEF DESCRIPTION OF THE DRAWINGS

One or more embodiments are illustrated by figures in the corresponding drawings, which are not intended to limit the embodiments, and the figures of the drawings are not intended to be limiting of scale unless specifically stated otherwise.

DETAILED DESCRIPTION

In order to make the purposes, technical solutions and advantages of embodiments of the disclosure clearer, the embodiments of the disclosure will be described in detail below in combination with the drawings. However, it will be appreciated by those of ordinary skill in the art that in the embodiments of the disclosure, numerous technical details are set forth in order to enable a reader to better understand the disclosure. However, the technical solutions claimed in the disclosure may be implemented even without these technical details and various changes and modifications based on the following embodiments.

Figure 1:
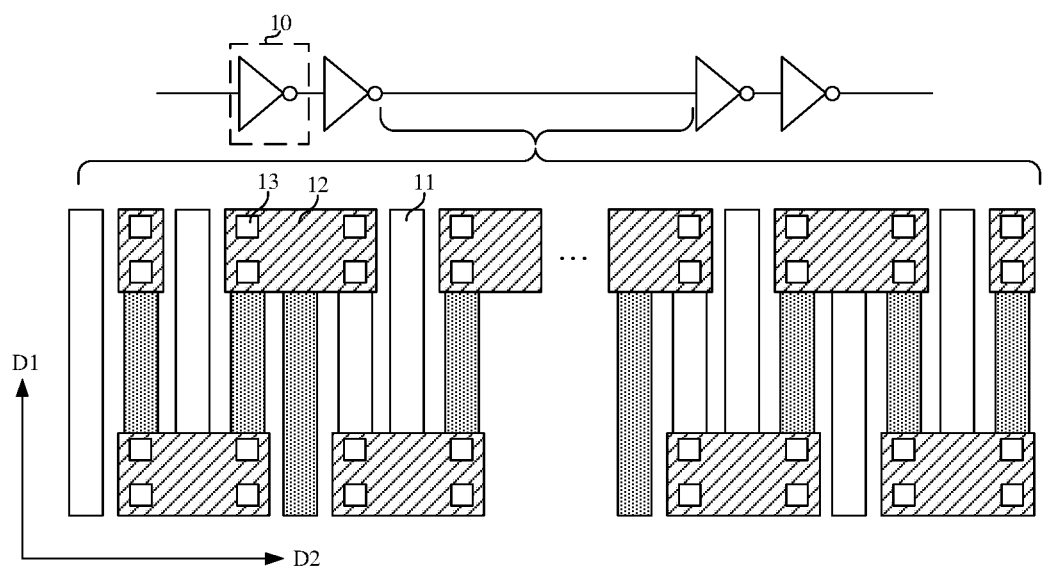
FIG. 1 illustrates a first structural schematic diagram of a clock circuit according to an embodiment of the disclosure.

Referring to FIG. 1, a clock circuit includes: at least two first driving circuits 10 and a plurality of discrete first wires 11 located between adjacent first driving circuits 10, the adjacent first driving circuits 10 are connected through at least one first wire 11 and at least two second wires 12, the first driving circuits 10 are connected with the second wires 12, all of the first wires 11 connected between two second wires 12 are connected in series with each other, the first wires 11 are located on a first metal layer, the second wires 12 are located on a second metal layer, and the second metal layer is above the first metal layer.

In some embodiments, the first wires 11 extend in a first direction D1, lengths of different first wires 11 are equal in the first direction D1, the plurality of first wires 11 are arranged side by side in a second direction D2, and the first direction D1 is perpendicular to the second direction D2. Because the second wires 12 are configured to connect the adjacent first wires 11, the extension direction of the second wires 12 is the same as the arrangement direction of the first wires 11, the arrangement direction of the first wires 11 is controlled to be perpendicular to the extension direction, so that layout areas of the first wires 11 and the second wires 12 are enabled to be rectangular, and therefore, the first wires 11 and the second wires 12 have relatively high layout regularity and occupy relatively small circuit areas.

It can be understood that compared with a parallelogram layout area, with the rectangular areas, space may be better utilized, so that the situation that due to the existence of bevel edges, other circuits may not be placed in part of included angle area actually is avoided, and in other words, the situation that the first wires 11 and the second wires 12 actually occupy overlarge circuit areas is avoided; and meanwhile, the rectangular layout areas have good circuit symmetry, and thus circuit design specifications may be met.

Figure 2:
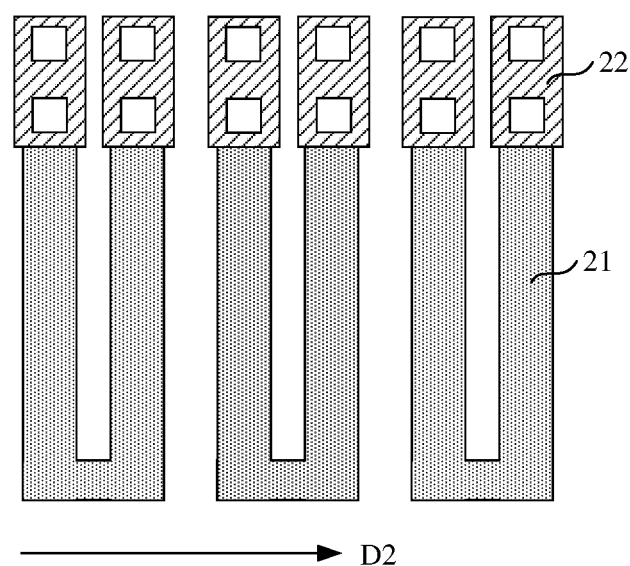
FIG. 2 illustrates a second structural schematic diagram of a clock circuit according to an embodiment of the disclosure.

In other embodiments, referring to FIG. 2, the first wires 21 are U-shaped, the plurality of first wires 21 are arranged side by side in a second direction D2, and orthographic projections of different second wires 22 in the second direction D2 coincide. By controlling the first wires 21 to be U-shaped, two ends of the first wires 21 may be located on the same straight line, so that the second wires 22 connecting the adjacent first wires 21 are located on the same straight line, therefore, the circuit area of the second wires 22 may be reduced, and more space may be reserved for other circuits.

In some embodiments, first drivers 10 include inverters; and in some embodiments, the first wires 11 and the second wires 12 are electrically connected by at least one conductive via 13. It is to be noted that in order to ensure effective electrical connection of the first wires 11 and the second wires 12, if the conductive via is a point-shaped conductive via, at least two conductive vias are provided to connect the first wires 11 and the second wires 12, so that the conductive vias 13 have a large contact area with the first wires 11 and the second wires 12; and if the conductive via is an elongated conductive via, at least one conductive via may be provided.

In some embodiments, the clock circuit further includes second driving circuits, adjacent second driving circuits are connected through third wires, a resistance between the adjacent second driving circuits is equal to a resistance between the adjacent first driving circuits 10, a total length of the third wires between the adjacent second driving circuits is larger than a total length of the first wires 11 between the adjacent first driving circuits 10, and the resistance per unit length of the third wires is smaller than the resistance per unit length of the first wires. Under the condition that the total length of the third wires is relatively large, the first wires 11 with relatively large resistance per unit length are controlled to be connected in series between the adjacent first driving circuits 10, so that a conductive path between the adjacent second driving circuits may be simulated under the condition that the total length of the wires is relatively short, metal delay (RC delay) of the wires between adjacent first driving circuits 10 is equal or close to metal delay of the wires between adjacent second driving circuits 10, that is, the signal transmission delay is equal or close.

In addition, the second driving circuits and the first driving circuits 10 may be the same type of driving circuits with the same parameters or equivalent parameters, the first driving circuits 10 and the second driving circuits are controlled to be the same or equivalent, and the metal delay between the adjacent first driving circuits 10 is controlled to be equal to or close to the metal delay between the adjacent second driving circuits, so that the conductive path where the first driving circuits 10 are located may serve as an auxiliary path of the conductive path where the second driving circuits are located, an output signal of the auxiliary path may be used as a feedback signal, and is configured to adjust an output signal of the main path, and therefore, the accuracy of the output signal of the main path is guaranteed.

The fact that the parameters are equivalent refers to that the electrical characteristics of the same driving circuit at different positions are different under the influence of the physical environment of the position, in order to enable the electrical characteristics of the same driving circuit at different positions to be the same, different circuit parameters need to be set for the driving circuit at different positions, so that the actual characteristics of the driving circuits at different positions are the same under the influence of the physical environment.

In some embodiments, the same metal layer adopts the same wire material, the different metal layers adopt different wire materials, and generally, the higher positions of the metal layers are, the smaller the resistance per unit length of the wires is. Because the second metal layer is above the first metal layer, the resistance per unit length of the second wires 12 is smaller than the resistance per unit length of the first wires 11, in order to enable the total resistance of the wires between adjacent first driving circuits 10 to be equal to the total resistance of the wires between adjacent second driving circuits, the resistance per unit length of the first wires 11 at least needs to be larger than the resistance per unit length of the third wires, that is, the metal layer where the third wires are located needs to be above the first metal layer.

In some embodiments, a resistance per unit length of the third wires may be smaller than or equal to a resistance per unit length of the second wires 12. Specifically, under the condition that the higher the position of the metal layer is, the smaller the resistance per unit length of the wire is, and no other metal layer exists between the second metal layer and the first metal layer, the metal layer where the third wires are located is above the first metal layer, that is, the third wires and the second wires 12 are located on the second metal layer, the resistance per unit length of the third wires is smaller than or equal to a resistance per unit length of the second wires, or the metal layer where the third wires are located is above the second metal layer, and the resistance per unit length of the third wires is smaller than the resistance per unit length of the second wires. In some embodiments, the resistance per unit length of the third wires is larger than the resistance per unit length of the second wires and smaller than the resistance per unit length of the first wires.

In some embodiments, the clock circuit includes: a first function module including at least two first driving circuits 10, where the first function module is configured to receive a first signal and generate and output a second signal based on the first signal, and the second signal is an internal feedback signal of the clock circuit; and a second function module including at least two second driving circuits, the second function module is configured to receive a third signal and generate and output a fourth signal based on the third signal, the first signal and the third signal are clock signals with the same phase, and the output end of the second function module serves as the output end of the clock circuit. The second function module is located in the main path, the first function module is located in the auxiliary path, and the second signal is configured to correct the fourth signal, so that the time sequence of the fourth signal meets the requirement.

The first function module and the second function module may include a plurality of function units which are connected in sequence, and the numbers of function units contained in the first function module and the second function module may be the same or different. Exemplarily, the first function module includes a first function unit and a second function unit which are sequentially connected, the second function module includes a third function unit and a fourth function unit which are sequentially connected, the first function unit is configured to receive a first signal, the input end of the second function unit is connected with the output end of the first function unit, the second function unit is configured to output a second signal, the third function unit is configured to receive a third signal, the input end of the fourth function unit is connected with the output end of the third function unit, the fourth function unit is configured to output a fourth signal, a number of the first driving circuits 10 contained in the first function unit is equal to a number of the second driving circuits contained in the third function unit, and a number of the first driving circuits 10 contained in the second function unit is equal to a number of the second driving circuits contained in the fourth function unit. The number of the function units contained in the different function modules are controlled to be the same and the number of the driving circuits contained in the two corresponding function units are controlled to be the same, so that the purpose that the delays of the different function modules are the same is simplified, that is, the delay of the first driving circuits 10 is the same as the delay of the second driving circuits, and the metal delay of the conductive path between the adjacent first driving circuits 10 is the same as the metal delay of the conductive path between the adjacent second driving circuits, so that the complexity of the clock circuit is reduced.

In some embodiments, the first function unit and the third function unit are clock trees, the second function unit and the fourth function unit are signal drivers, the first signal and the third signal are clock signals for data transmission, and the second signal and the fourth signal are clock signals for output and readout.

Figure 3:
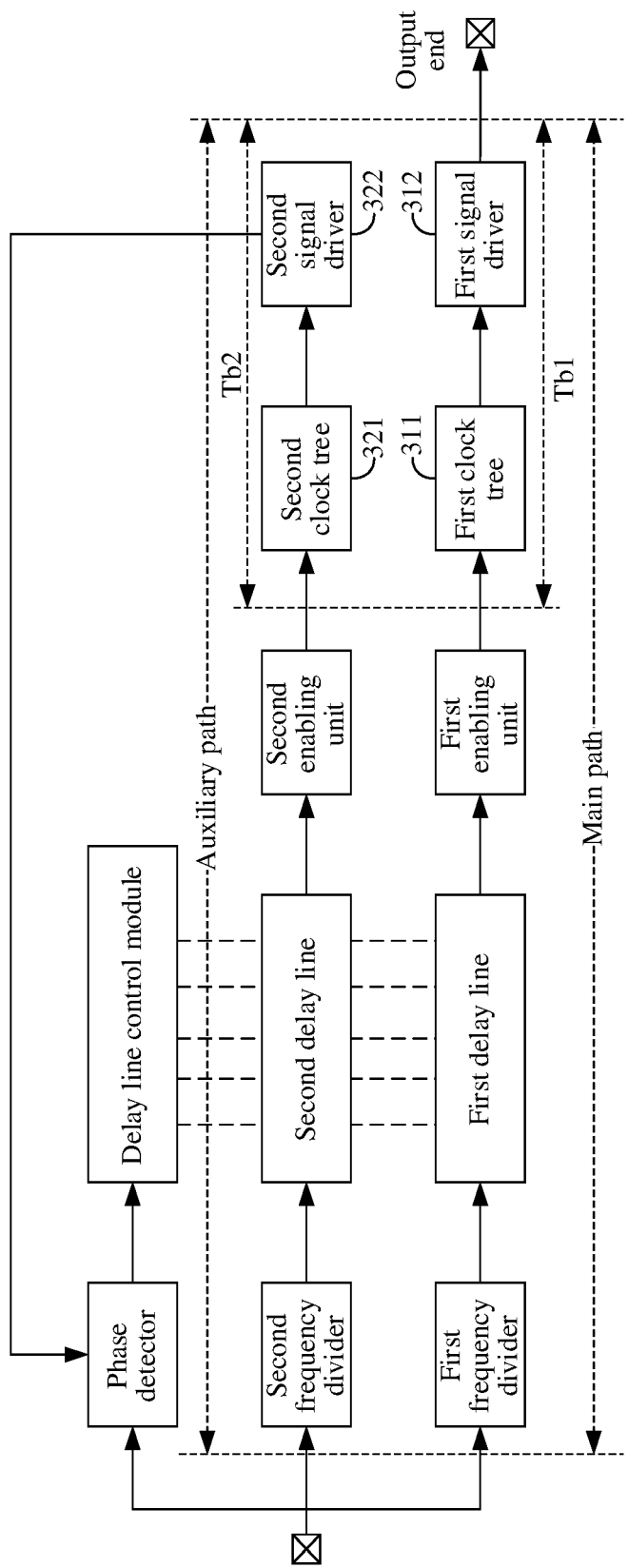
FIG. 3 illustrates a third structural schematic diagram of a clock circuit according to an embodiment of the disclosure.

Exemplarily, referring to FIG. 3, the clock circuit includes a main path, an auxiliary path, a phase detector and a delay line control module, the main path includes a first frequency divider, a first delay line, a first enabling unit, a first clock tree 311 and a first signal driver 312 which are sequentially connected, the auxiliary path includes a second frequency divider, a second delay line, a second enabling unit, a second clock tree 321 and a second signal driver 322 which are sequentially connected, the first function module includes a second clock tree 321 and a second signal driver 322, and the second function module includes a first clock tree 311 and a first signal driver 312. The output end of the second function module serves as the output end of the clock circuit and needs to be connected with a remote external circuit or an output bonding pad, so that a total length of wires in the second function module is relatively large, under the condition that the number of the driving circuits corresponding to the first function module and the number of the driving circuits corresponding to the second function module are equal, the resistance per unit length of first wires between adjacent first driving circuits in the first function module is controlled to be smaller than the resistance per unit length of the third wires between adjacent second driving circuits in the second function module, the total resistance of the wires between the adjacent first driving circuits is enabled to be equal to the total resistance of the wires between the adjacent second driving circuits, so that first delay Tb2 corresponding to the first function module is enabled to be equal to or close to second delay Tb1 of the second function module.

In the embodiment, the first metal layer is provided with a plurality of discrete first wires, the second metal layer higher than the first metal layer is provided with the second wires, the second wires are configured to connect the plurality of first wires in the first metal layer between adjacent first driving circuits in series, so that the resistance between the adjacent first driving circuits is controlled, if the resistance between the adjacent first driving circuits needs to be adjusted, only a layout of the second wires needs to be adjusted so that more or less first wires may be connected in series between the adjacent first driving circuits, that is, only the second metal layer and a dielectric layer between the second metal layer and the first metal layer need to be removed, and there is no need to remove the first metal layer to perform re-layout on the first metal layer, so that the adjustment cost is reduced, and the adjustment time is shortened.

The embodiments of the disclosure further provide a memory, which includes any of the above-mentioned clock circuit. When the resistance of the wires between the adjacent first driving circuits needs to be adjusted, only the second metal layer and the dielectric layer between the second metal layer and the first metal layer need to be removed, and there is no need to remove the first metal layer to perform re-layout on the first metal layer, so that the adjustment cost is reduced, and the adjustment time is shortened.

Figure 4:
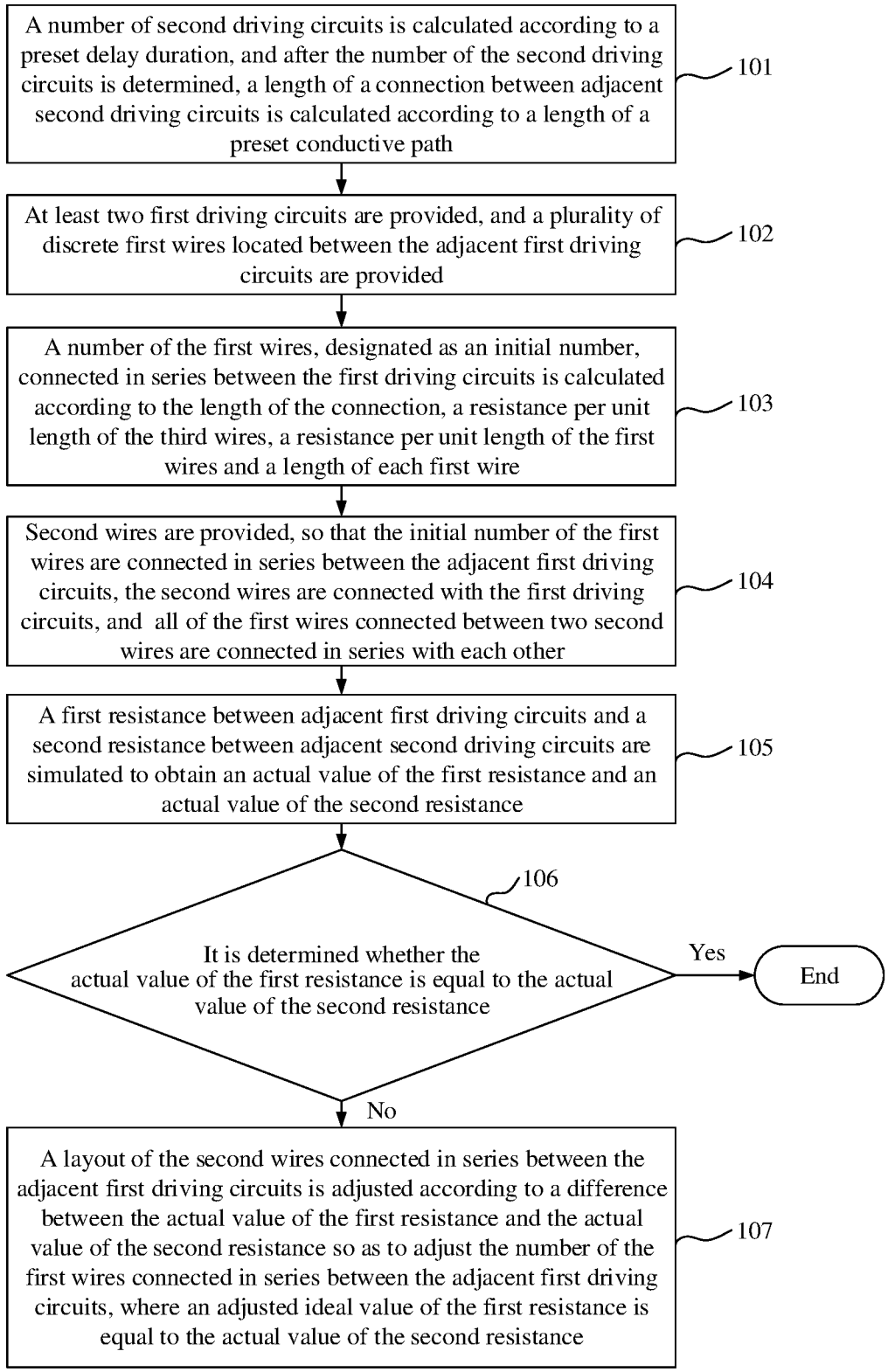
FIG. 4 illustrates a flow diagram corresponding to steps in a method for manufacturing a semiconductor structure according to an embodiment of the disclosure.

The embodiments of the disclosure further provide a method for manufacturing a semiconductor structure. Referring to FIG. 4, the method for manufacturing a semiconductor structure includes the following operations.

In S101, a number of second driving circuits is calculated according to a preset delay duration, and after the number of the second driving circuits is determined, a length of a connection between adjacent second driving circuits is calculated according to a length of a preset conductive path.

The preset delay duration may be determined according to the requirement of a transmission time sequence of a data signal, the length of the preset conductive path is a sum of the total length of wires in a corresponding function module (such as a second function module) and the total length of the second driving circuits, because the total length of the wires is generally much larger than the total length of the second driving circuits, in some embodiments, the total length of the second driving circuits is negligible, and the length of the preset conductive path is approximately equal to the total length of the wires. The adjacent second driving circuits may be connected through third wires.

In S102, at least two first driving circuits are provided, and a plurality of discrete first wires located between adjacent first driving circuits are provided.

In some embodiments, a number of the first driving circuits is equal to a number of the second driving circuits, the first wires are located on a first metal layer, a metal layer where the third wires are located is above the first metal layer, and a resistance per unit length of the third wires is smaller than a resistance per unit length of the first wires. It can be understood that in order to ensure that the total resistance of the wires connected in series between the adjacent first driving circuits is equal to the total resistance of the third wires connected in series between the adjacent second driving circuits, margin needs to be reserved when the first wires are provided, namely, the total resistance of series connection of the plurality of first wires arranged between the adjacent first driving circuits is larger than the total resistance of the third wires arranged between the adjacent second driving circuits.

In S103, a number of the first wires, designated as an initial number, connected in series between the first driving circuits is calculated according to the length of the connection, a resistance per unit length of the third wires, a resistance per unit length of the first wires and a length of each first wire.

The purpose of calculating the initial number is to make an ideal value of resistance between the adjacent first driving circuits equal to an ideal value of resistance between the adjacent second driving circuits, it can be understood that the ideal value of resistance is the resistance value of the wires, and a conductive via belongs to one of the wires.

In some embodiments, the resistance per unit length of second wires configured to connect the first wires is much smaller than the resistance per unit length of the first wires, even smaller than the resistance per unit length of the third wires, so that the resistance of the second wires is ignored when the number of the first wires is calculated, that is, the number of the first wires*the length of each first wire*the resistance per unit length of the first wires=the length of the connection*the resistance per unit length of the third wires; in other embodiments, the resistance per unit length and the length of the second wires configured to connect the first wires in series are also considered when the number of the first wires is calculated, the number of the first wires*the length of each first wire*the resistance per unit length of the first wires+the unit length resistance of the second wires*the total length of the second wires=the length of the connection*the resistance per unit length of the third wires; and in still other embodiments, the resistance of the conductive vias connecting the first wires and second wires is also considered, and the contact resistance of the conductive vias with the first wires and second wires is also considered.

In S104, the second wires are provided, so that the initial number of the first wires are connected in series between the adjacent first driving circuits, the second wires are connected with the first driving circuits, and all of the first wires connected between two second wires are connected in series with each other.

After the initial number is determined, a corresponding first wire is selected; a dielectric layer covering the first metal layer is prepared, and the top surface of the dielectric layer is a second metal layer; patterning etching is carried out on the dielectric layer to form conductive through holes, and two ends of the selected first wire are exposed by the conductive through holes; the conductive through holes are filled with a conductive medium to form the conductive vias; and the second wires are formed on the second metal layer, and the second wires are configured to connect the conductive vias so as to connect the initial number of the first wires in series. It can be understood that the second wires are located on the second metal layer, and the second metal layer is above the first metal layer.

In some embodiments, after the second wires are provided to connect the first wires and connect adjacent first driving circuits, an emulation test of the resistance between the adjacent first driving circuits is also required. Specific steps are as follows.

At S105, a first resistance between adjacent first driving circuits and a second resistance between adjacent second driving circuits are simulated to obtain an actual value of the first resistance and an actual value of the second resistance.

Under the influence of factors such as stress influence and wiring defect, the actual value of the first resistance obtained through simulation may deviate from the ideal value of the first resistance, and the actual value of the second resistance may deviate from the ideal value of the second resistance.

At S106, whether the actual value of the first resistance is equal to the actual value of the second resistance or not is judged. If so, the preset purpose is achieved, and the process may be ended; otherwise, S107 needs to be further performed to adjust the ideal value of the first resistance.

At S107, a layout of the second wires connected in series between the adjacent first driving circuits is adjusted according to a difference between the actual value of the first resistance and the actual value of the second resistance so as to adjust the number of the first wires connected in series between the adjacent first driving circuits, where an adjusted ideal value of the first resistance is equal to the actual value of the second resistance.

The adjusted first resistance only has an ideal value before a new round of simulation is carried out, this is because the reduced or increased first wires and second wires only have the ideal resistance value, and the addition and subtraction operation result of the actual resistance value and the ideal resistance value is still the ideal resistance value.

In some embodiments, the operation that the layout of the second wires is adjusted includes: the second wires and the dielectric layer between the first metal layer and the second metal layer are removed; a new dielectric layer and new conductive vias are formed, namely, the positions of the conductive vias are adjusted, and the conductive vias are configured to connect newly determined first wires to be connected in series; and new second wires are formed, namely, the positions of the second wires are adjusted to enable the second wires to be connected with another first wire through the conductive vias, and the newly determined first wires are connected in series between the adjacent first driving circuits.

After the layout of the second wires is adjusted, simulation may be carried out again to determine whether the adjusted actual value of the first resistance is equal to the actual value of the second resistance or not, if so, the process is ended, otherwise, the layout of the second wires may be adjusted again and simulation is repeated till the actual value of the first resistance is equal to the actual value of the second resistance.

It is to be noted that in some embodiments, the actual values of the first resistance and the second resistance are simulated, and it is determined, according to the obtained actual value of the first resistance and the actual value of the second resistance, whether signal delay caused by the first resistance is equal to signal delay caused by the second resistance; in other embodiments, the delay caused by the first resistance and the second resistance is simulated, the actual delay caused by the first resistance and the actual delay caused by the second resistance are directly compared, if the actual delay caused by the first resistance is not equal to the actual delay caused by the second resistance, a layout of the second wires is adjusted according to the difference value of the actual delay, so that the number of the first wires connected between the adjacent first driving circuits in series is adjusted to enable, the adjusted ideal delay of the first resistance to be equal to the actual delay of the second resistance, or a layout of the second wires is repeatedly adjusted and simulation is carried out repeatedly to enable the actual delay of the first resistance to be equal to the actual delay of the second resistance.

In addition, the simulation stage is generally before chip manufacturing is completed, and besides that the layout of the second wires may be adjusted in the simulation stage, if it is found that the chip time sequence does not meet the requirement in the test stage after chip manufacturing is completed, the time sequence may be adjusted by adjusting the layout of the second wires, so that the adjusted time sequence meets the requirement. Similarly, when the layout of the second wires is adjusted in the test stage, only the second metal layer and the dielectric layer at the bottom need to be removed, the first metal layer does not need to be removed, so that the adjustment cost is reduced, and the adjustment duration is shortened.

In the embodiment, the first metal layer is provided with the plurality of discrete first wires, the second metal layer higher than the first metal layer is provided with the second wires, the second wires are configured to connect the plurality of first wires in the first metal layer between adjacent first driving circuits in series, so that the resistance between the adjacent first driving circuits is controlled, if the resistance between the adjacent first driving circuits needs to be adjusted, only a layout of the second wires needs to be adjusted so that more or less first wires may be connected in series between the adjacent first driving circuits, that is, only the second metal layer and the dielectric layer between the second metal layer and the first metal layer need to be removed, and there is no need to remove the first metal layer to perform re-layout on the first metal layer, so that the adjustment cost is reduced, and the adjustment time is shortened.

It can be understood by those of ordinary skill in the art that the implementation modes described above are specific embodiments for implementing the disclosure, and in practical applications, various changes in form and detail may be made therein without departing from the spirit and scope of the disclosure. Any person skilled in the art may make various changes and modifications without departing from the spirit and scope of the disclosure, and therefore the scope of the disclosure should be defined by the claims.

What is claimed is:

1. A clock circuit, comprising:
at least two first driving circuits and a plurality of discrete first wires located between adjacent first driving circuits, wherein the adjacent first driving circuits are connected through at least one first wire and at least two second wires, the first driving circuits are connected with the second wires, all of the first wires connected between two second wires are connected in series with each other, the first wires are located on a first metal layer, the second wires are located on a second metal layer, and the second metal layer is above the first metal layer; and
second driving circuits, wherein adjacent second driving circuits are connected through third wires, a resistance between the adjacent second driving circuits is equal to a resistance between the adjacent first driving circuits, a total length of the third wires between the adjacent second driving circuits is larger than a total length of the first wires between the adjacent first driving circuits, and a resistance per unit length of the third wires is smaller than a resistance per unit length of the first wires.

2. The clock circuit of claim 1, wherein the first wires extend in a first direction, lengths of different first wires are equal in the first direction, the plurality of first wires are arranged side by side in a second direction, and the first direction is perpendicular to the second direction.

3. The clock circuit of claim 1, wherein the first wires are U-shaped, the plurality of first wires are arranged side by side in a second direction, and orthographic projections of the different second wires in the second direction coincide.

4. The clock circuit of claim 1, wherein a resistance per unit length of the second wires is smaller than the resistance per unit length of the first wires, and a metal layer where the third wires are located is above the first metal layer.

5. The clock circuit of claim 1, wherein the resistance per unit length of the third wires is smaller than or equal to a resistance per unit length of the second wires.

6. The clock circuit of claim 5, wherein a metal layer where the third wires are located is above the second metal layer, or the third wires are located on the second metal layer.

7. The clock circuit of claim 1, further comprising:
a first function module, comprising at least two first driving circuits, and configured to receive a first signal and generate and output a second signal based on the first signal, wherein the second signal serves as an internal feedback signal of the clock circuit; and
a second function module, comprising at least two second driving circuits, and configured to receive a third signal and generate and output a fourth signal based on the third signal, wherein the first signal and the third signal are clock signals with the same phase, and the output end of the second function module serves as the output end of the clock circuit.

8. The clock circuit of claim 7, wherein the first function module comprises a first function unit and a second function unit which are sequentially connected, and the second function module comprises a third function unit and a fourth function unit which are sequentially connected, wherein the first function unit is configured to receive the first signal, the second functional unit is configured to output the second signal, the third function unit is configured to receive the third signal, the fourth function unit is configured to output the fourth signal, a number of the first driving circuits contained in the first function unit is equal to a number of the second driving circuits contained in the third function unit, and a number of the first driving circuits contained in the second function unit is equal to a number of the second driving circuits contained in the fourth functional unit.

9. The clock circuit of claim 8, wherein the first function unit and the third function unit are clock trees, the second function unit and the fourth function unit are signal drivers, the first signal and the third signal are clock signals for data transmission, and the second signal and the fourth signal are clock signals for data readout.

10. The clock circuit of claim 1, wherein the first driving circuits comprise inverters.

11. The clock circuit of claim 1, wherein the first wires and the second wires are electrically connected through at least one conductive via.

12. A memory, comprising the clock circuit of claim 1.

* * * * *